(12) United States Patent
Divakar

(10) Patent No.: US 6,723,274 B1
(45) Date of Patent: Apr. 20, 2004

(54) HIGH-PURITY LOW-RESISTIVITY ELECTROSTATIC CHUCKS

(75) Inventor: Ramesh Divakar, Shrewsbury, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 09/458,278

(22) Filed: Dec. 9, 1999

(51) Int. Cl.$^7$ ............................................. C04B 35/582
(52) U.S. Cl. ...................... 264/662; 264/618; 264/653; 264/664; 264/666; 264/676; 264/663
(58) Field of Search ................. 264/618, 647, 264/653, 662, 664, 666, 676, 663

(56) References Cited

U.S. PATENT DOCUMENTS

| | | | | |
|---|---|---|---|---|
| 4,650,777 A | * | 3/1987 | Kurokawa et al. | 501/96 |
| 4,652,318 A | | 3/1987 | Masuda et al. | 156/89 |
| 4,778,778 A | * | 10/1988 | Mallia et al. | 501/96 |
| 4,908,173 A | | 3/1990 | Schwetz et al. | 264/63 |
| 4,922,099 A | | 5/1990 | Masuda et al. | 250/324 |
| 4,992,253 A | | 2/1991 | Wu et al. | 423/412 |
| 5,280,156 A | | 1/1994 | Niori et al. | 219/385 |
| 5,306,895 A | | 4/1994 | Ushikoshi et al. | 219/385 |
| 5,320,990 A | * | 6/1994 | Guiton et al. | 501/98 |
| 5,343,150 A | | 8/1994 | Nakahata et al. | 324/316 |
| 5,413,360 A | | 5/1995 | Atari et al. | 279/128 |
| 5,457,075 A | * | 10/1995 | Fukushima et al. | 501/96 |
| 5,522,131 A | | 6/1996 | Steger | 29/829 |
| 5,541,145 A | | 7/1996 | Harris et al. | 501/96 |
| 5,560,780 A | | 10/1996 | Wu et al. | 118/728 |

(List continued on next page.)

FOREIGN PATENT DOCUMENTS

| | | |
|---|---|---|
| EP | 0 855 764 | 7/1988 |
| EP | 0 360 529 A2 | 3/1990 |
| EP | 0 506 537 A1 | 9/1992 |
| EP | 0 680 075 A1 | 5/1995 |
| EP | 0771 772 A2 | 5/1997 |
| EP | 0 791 956 A2 | 8/1997 |
| EP | 0 856 881 A2 | 8/1998 |
| EP | 0 882689 A2 | 12/1998 |
| EP | 0 886 312 | 12/1998 |
| EP | 1 030 364 A2 | 8/2000 |
| WO | WO 97/35816 | 10/1996 |

OTHER PUBLICATIONS

Hazelton, C., et al., "Effect of Neutron Radiation on the Dielectric, Mechanical and Thermal Properties of Ceramics for RF Transmission Windows," *Journal of Nuclear Materials 253*:190–195 (1998).

Kuramoto, N., et al., "Translucent AlN Ceramic Substrate," *IEEE Transactions on Components, Hybrids, and Manufacturing Technology* vol. CHMT–9:4:386–390 (1986).

Zulfequar, M. and Kumar, A., "Electrical Conductivity of Hot–pressed AlN Ceramic: Effecti of Various Oxide Additives," *Journal of Materials Science 22*:4056–4060 (1987).

Baker, H., et al., Eds., 3.56/Ternary Alloy Phase Diagrams, ASM Handbook, vol. 3 (1992).

Hansen, M., "Constitution of Binary Alloys," 482–483, 518–519, 968–969 and 1057–1059 (1958).

*Primary Examiner*—James Derrington
(74) *Attorney, Agent, or Firm*—Toler, Larson & Abel, LLP

(57) ABSTRACT

The volume resistivity of a body consisting essentially of aluminum nitride is reduced by exposing the body to a soak temperature of at least about 1000° C. in an atmosphere deficient in nitrogen, such as an atmosphere consisting essentially of argon. The body can be, for example, a green body of aluminum nitride powder of a densified, or sintered body, such as a polycrystalline body. An electrostatic chuck has an electrode within a chuck body. A first portion of the chuck body, at a first side of the electrode, has a volume resistivity less than about $1 \times 10^{13}$ ohm·cm at about 23° C. A second portion of the body, at a second side of the electrode, has a volume resistivity within one order of magnitude that of the first portion.

43 Claims, 5 Drawing Sheets

U.S. PATENT DOCUMENTS

| | | | |
|---|---|---|---|
| 5,607,541 A | 3/1997 | Kubota et al. | 156/538 |
| 5,633,073 A | 5/1997 | Cheung et al. | 428/209 |
| 5,677,253 A | 10/1997 | Inoue et al. | 501/98 |
| 5,705,450 A | 1/1998 | Chiao | 501/98 |
| 5,708,557 A | 1/1998 | Feigenbaum et al. | 361/234 |
| 5,728,635 A | 3/1998 | Kobayashi et al. | 501/98.4 |
| 5,753,132 A | 5/1998 | Shamouilian et al. | 216/33 |
| 5,800,618 A | 9/1998 | Niori et al. | 118/723 E |
| 5,817,406 A | 10/1998 | Cheung et al. | 428/210 |
| 5,880,922 A | 3/1999 | Husain | 361/234 |
| 5,886,863 A | 3/1999 | Nagasaki et al. | 361/234 |
| 5,908,799 A | 6/1999 | Kobayashi et al. | 501/98.4 |
| 5,909,355 A | 6/1999 | Parkhe | 361/234 |
| 5,923,521 A | 7/1999 | Burkhart | 361/234 |
| 5,958,813 A | 9/1999 | Aida et al. | 501/98.4 |
| 6,017,485 A * | 1/2000 | Enck et al. | 264/676 |

\* cited by examiner

HIGH-PURITY LOW-RESISTIVITY ELECTROSTATIC CHUCKS

BACKGROUND OF THE INVENTION

Electrostatic chucks, also known as susceptors, are employed to support various substrates, such as wafers, during the manufacture of semiconductor devices. Electrostatic chucks often are fabricated from ceramic materials. Among these, aluminum nitride (AlN) ceramics have a number of attractive properties such as, for example, good shock resistance, good thermal conductivity, good thermal expansion match to silicon, and good erosion and corrosion resistance to plasma.

Both coulombic and Johnson-Rahbek types of chucks can be employed in wafer manufacturing. To operate in the Johnson-Rahbek mode, the volume (or dielectric) resistivity of the chuck typically is in a range from about $10^8$ to about $10^{13}$ ohm·cm at operating temperature and preferably in a range from about $10^9$ to about $10^{11}$. For instance, in a dry etch process, where the wafers are processed near room temperature, the chuck generally should exhibit a resistivity of $10^9$-$10^{11}$ ohm·cm at room temperature. For vapor deposition processes (PVD and CVD), the chuck exhibits the $10^9$-$10^{11}$ ohm·cm volume resistivity range at higher temperatures, for example, from about 250° C. to about 700° C.

The volume resistivities of aluminum nitride ceramics, however, generally tend to be higher than those considered suitable for fabricating Johnson-Rahbek electrostatic chucks. For example, at room temperature, the volume resistivity of an aluminum nitride ceramic body, in the absence of dopants, generally is above about $10^{13}$ ohm·cm.

Methods employed to lower the volume resistivity of dense aluminum nitride bodies include adding small amounts of metals or carbon to the aluminum nitride material. In wafer manufacturing, however, impurities present in the chuck body can contaminate the wafer and are generally undesirable.

Impurities can also be introduced into AlN ceramics in the form of sintering aids used to promote densification during conventional (pressureless) sintering. Examples of sintering aids include yttrium oxide ($Y_2O_3$), calcium fluoride ($CaF_2$), calcium oxide (CaO) and calcium carbonate ($CaCO_3$). Typical amounts employed are generally in the range of 0.1 to 3 weight percent. One disadvantage associated with the presence of sintering aids is the formation of metal-aluminate phases such as, for example, yttrium aluminate. During wafer manufacturing, such phases can be attacked by plasma and can generate undesirable contamination of the wafer.

One process for forming an electrostatic chuck employs a raw AlN material having a metal content, other than aluminum, of less than about 100 ppm. The raw material is sintered in an inert atmosphere, such as nitrogen. However, the extent to which volume resistivity can be lowered by such methods generally has been limited.

One method of modifying the dielectric properties of an aluminum nitride body employs conventional (pressureless) sintering and cooling under an argon atmosphere. Since as much as a few percent by weight of $Y_2O_3$ is added as a sintering aid, to achieve densification, the resulting material is not high in purity and can exhibit undesirable yttrium aluminate phases. Furthermore, the room temperature volume resistivity of electrostatic chucks fabricated by this method generally are too high for Johnson-Rahbek applications.

Therefore, a need exists for a high purity aluminum nitride ceramic having a volume resistivity suitable for the manufacture of Johnson-Rahbek type electrostatic chucks.

SUMMARY OF THE INVENTION

It has been found that a dense, high purity aluminum nitride ceramic material having a room temperature volume resistivity lower than about $1 \times 10^{13}$ ohm·cm at a temperature of about 23° C. can be produced by heat treating a hot pressed ceramic body consisting essentially of aluminum nitride in an atmosphere deficient in nitrogen.

The present invention is generally directed to a method of reducing the volume resistivity of a body consisting essentially of aluminum nitride. The method includes exposing the body to a soak temperature of at least about 1000°C. in an atmosphere deficient in nitrogen.

In another embodiment, the invention is a method for forming a polycrystalline aluminum nitride body having a volume resistivity less than about $1 \times 10^{13}$ ohm·cm. In this embodiment, a green body consisting essentially of aluminum nitride is sintered to form a polycrystalline body. The polycrystalline body is exposed to a soak temperature of at least about 1000° C. in an atmosphere deficient in nitrogen for a period of time sufficient to cause the volume resistivity of the polycrystalline body to be less than about $1 \times 10^{13}$ ohm·cm at a temperature of about 23° C.

In still another embodiment, the invention is a method for reducing the volume resistivity of an electrostatic chuck consisting essentially of aluminum nitride. In this embodiment, at least a portion of the electrostatic chuck is exposed to a soak temperature of at least about 1000° C. in an atmosphere deficient in nitrogen.

The invention also is directed to an electrostatic chuck. The electrostatic chuck includes an electrode having a first side and a second side, and a body having a first portion at the first side of the electrode and a second portion at the second side of the electrode. The first portion of the chuck body has a volume resistivity less than about $1 \times 10^{13}$ ohm·cm. The volume resistivity of the second portion is within one order of magnitude that of the first portion.

The invention has numerous advantages. For example, the invention can produce polycrystalline aluminum nitride bodies having a density higher than 98 % of the theoretical density, a volume resistivity lower than $10^{13}$ ohm·cm at room temperature and which typically include no more than about 1000 ppm total metal impurities and no more than about 500 ppm carbon, and preferably, less than 490 ppm carbon. The bodies can be produced in the absence of sintering aids and have properties which render it particularly attractive in the fabrication of electrostatic chucks capable of operating in the Johnson-Rahbek mode. The electrostatic chucks of the invention can be manufactured in a reproducible manner and have a volume resistivity which is highly uniform throughout the chuck body.

DETAILED DESCRIPTION OF THE INVENTION

Figure 1:
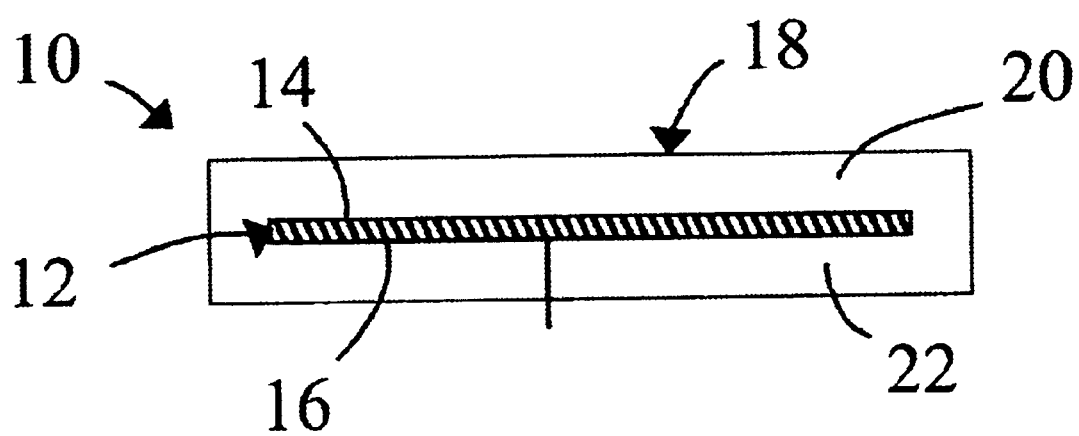
FIG. 1 is a cross sectional view of an electrostatic chuck of the invention.

The features and other details of the invention, either as steps of the invention or as combination of parts of the invention, will now be more particularly described with reference to the accompanying drawings and pointed out in the claims. It will be understood that the particular embodiments of the invention are shown by way of illustration and not as limitations of the invention. The principle features of this invention may be employed in various embodiments without departing from the scope of the invention.

The present invention generally is directed to a method for reducing volume resistivity of a body consisting essentially of aluminum nitride. In another embodiment, the invention is directed to forming a polycrystalline aluminum nitride body having a volume resistivity less than about $1 \times 10^{13}$ ohm·cm at a temperature of about 23° C. In a further embodiment, the invention is directed to a method of reducing the volume resistivity of electrostatic chuck consisting essentially of aluminum nitride. In still another embodiment, the invention is directed to an electrostatic chuck, wherein a first portion of the body has a volume resistivity less than about $1 \times 10^{13}$ ohm·cm at a temperature of about 23° C., and wherein the volume resistivity of a second portion is within one order of magnitude that of the first portion.

The method includes exposing a body consisting essentially of aluminum nitride to a temperature of at least about 1000° C. in an atmosphere deficient in nitrogen. Preferably, the body includes no more than 1000 ppm metal impurities, more preferably no more than 500 ppm and most preferably no more than 250 ppm metal impurities. "Metal impurities," as defined herein, means metals other than aluminum and silicon.

In one embodiment, the body is a green body. As defined herein, a "green body" means a compacted predensified body of a powder which, upon densification, also known as sintering, will form a ceramic body. A suitable aluminum nitride powder has a content of metal impurities lower than about 1000 ppm. In one embodiment, the aluminum nitride powder has silicon and boron impurities lower than about 500 ppm and 100 ppm, respectively.

Examples of suitable powders include those having an average particle size in a range of between about 0.1 µm and about 5.0 µm. Preferably, the powder has a medium particle size of at least about 1.4 µm. Also, preferably, the powder has a specific surface area less than about 4.5 m²/g. Commercial or technical grades of powder can be employed. Examples of commercially available AlN powders include, but are not limited to, Tokuyama Soda Grade F (TS-F) and Tokuyama Soda Grade H (TS-H) powders, Elf Atochem Grade A4 powder, Starck Grade C powder and others.

The powder can be formed into a green body by a suitable method, such as in known in the art. An example of a suitable method of forming a green body is cold pressing. Alternatively, the powder can be formed into a green body by tape casting. Preferably, no binders or sintering aids are combined with the powder to form the green body.

Alternatively, the body consisting essentially of aluminum nitride can be a sintered body. In a particularly preferred embodiment, the body consisting essentially of aluminum nitride is polycrystalline. Preferably, the polycrystalline body has a relative density greater than about 98% of its theoretical density.

As defined herein, an atmosphere "deficient in nitrogen" means an atmosphere that includes a partial pressure of nitrogen less than that of about 35 kPa. It is believed that, by exposing powder or densified bodies consisting essentially of aluminum nitride to temperatures above about 1000° C. and an atmosphere deficient in nitrogen, an increased number of nitrogen vacancies are created in the aluminum nitride that significantly diminishes substitution of nitrogen by dissolved oxygen impurity. A diminished presence of oxygen in the aluminum nitride, in turn, significantly lowers volume resistivity.

Optionally the atmosphere can include at least one other suitable inert gas. In one embodiment, the atmosphere is selected from the group consisting essentially of argon, helium and mixtures thereof In a preferred embodiment, the atmosphere consists essentially of argon.

A "soak temperature," as defined herein, means the temperature at which a body is maintained in an atmosphere deficient in nitrogen and which is in excess of 1000° C. A soak temperature can be a temperature at which a body is being sintered concurrently. Alternatively, the soak temperature can be a temperature lower than that necessary to cause sintering of a green body.

In one embodiment, the body is exposed to a soak temperature of at least about 1200° C. In a preferred embodiment, the body is exposed to a soak temperature of at least about 1500° C. In a particularly preferred embodiment, the body is exposed to a soak temperature of at least about 1650° C.

The body is exposed to a soak temperature for a period of time sufficient to cause the volume resistivity of the body to be reduced to less than about $10^{13}$ ohm·cm at a temperature of about 23° C. In one embodiment, the body is exposed to a soak temperature for a period of at least about 0.5 hours, after the body has reached thermal equilibrium. Preferably, the body is exposed to a soak temperature for a period of at least about 4 hours.

The atmosphere deficient in nitrogen, in one embodiment, is at a pressure in a range of between about 1 Pa and about 14 kPa. In another embodiment, the atmosphere is at a pressure in a range of between about 7 kPa and about 14 kPa.

The body can be exposed to a soak temperature in an atmosphere deficient in nitrogen according to the method of the invention at any time prior to, during or after densification of a suitable green body. In a preferred embodiment, a green body is exposed to a soak temperature in a range of between about 1000° C. and 2000° C. in an atmosphere deficient in nitrogen for a period of time, after the body has reached thermal equilibrium, in a range of between about 0.5 and about 4 hours. Most preferably, in this embodiment, the atmosphere consists essentially of argon and is at a pressure in a range of between about 7 kPA and about 14 kPa.

In still another embodiment, the method of the invention includes exposing a densified body to an atmosphere deficient in nitrogen while cooling the body following densification. In this embodiment, the densified body preferably is cooled at a rate of less than about 15° C. per minute to a temperature in a range of between about 1650° C. and about 1000° C. Most preferably, the densified body is cooled to a temperature of about 1650° C. Preferably, the densified, or polycrystalline, body is then maintained at a soak temperature of about 1650° C. for a period of at least about 4 hours. Preferably, the atmosphere is maintained at a pressure of about 7–14 kPa during cooling of the densified body and during maintenance at the temperature of 1650° C. Optionally, the densified body then can be cooled at a rate of about 15° C. per minute to a temperature of about 1500° C. Preferably, the atmosphere is maintained at a pressure of about 20 MPa and remains an atmosphere that deficient in nitrogen. Thereafter, the densified body can be maintained at a soak temperature of about 1500° C. In one embodiment, the densified body is maintained at a soak temperature of 1500° C. for a period of time, after the body has reached thermal equilibrium, in a range of between about 0.5 and about 4 hours. Thereafter, the densified body is cooled to an ambient temperature.

In another embodiment, the densified body is cooled following densification to a temperature of about 1500° C. and maintained at that temperature for a period of time, after the body has reached thermal equilibrium, in a range, for example, of between about 0.5 and about 4 hours. Alternatively, the densified body is cooled following densification to a temperature of about 1200° C. and maintained at that temperature for a period of time, after the body has reached thermal equilibrium, for example, of between about 0.5 and about 4 hours. In both embodiments, a preferred rate of cooling is about 15° C. per minute. Also, in both embodiments, the atmosphere preferably is maintained at about the same pressure employed during densification.

In one embodiment, the body consisting essentially of aluminum nitride is exposed to a temperature of at least about 1000° C. in an atmosphere deficient in nitrogen for a period of time sufficient to cause the volume resistivity of the body at a temperature of about 23° C. to be in a range of between about $1 \times 10^8$ ohm·cm and about $1 \times 10^{13}$ ohm·cm. Preferably, the body is exposed to a temperature in excess of 1000° C. in an atmosphere deficient in nitrogen for a period of time sufficient to cause the volume resistivity of the body at a temperature of about 23° C. to be in a range of between about $1 \times 10^8$ and about $5 \times 10^{12}$ ohm·cm.

In one preferred embodiment, the invention is a method for forming a polycrystalline aluminum nitride body having a volume resistivity of less than about $1 \times 10^{13}$ ohm·cm at a temperature of about 23° C. The method includes sintering a green body consisting essentially of aluminum nitride to form a polycrystalline body. In one embodiment, the green body includes aluminum nitride powder having a particle size in a range of between about 0.1 μm and about 5.0 μm. Preferably, the aluminum nitride powder is selected from the group consisting of A and B, and mixtures thereof. Most preferably, the aluminum nitride powder consists essentially of B powder. The powder characteristics for these powders are given in Table 1. In one embodiment, the green body is sintered in a nitrogen deficient atmosphere. Preferably, the atmosphere consists essentially of argon. In one embodiment, the green body is sintered at a pressure in a range of between about 10 MPa and about 50 MPa. Preferably, the green body is sintered at a pressure of at least about 10 MPa. In one embodiment, the green body is sintered at a temperature of at least about 1650° C. for a period of time of at least about 4 hours. Preferably, the green body is sintered until it has been densified to at least about 98% of the theoretical density of the aluminum nitride powder.

Optionally, the powder employed to form the body exposed to a soak temperature of at least about 1000° C. in a nitrogen deficient atmosphere also can be exposed to a soak temperature of at least about 1000° C. in a nitrogen deficient atmosphere, such as, for example, Ar. In one embodiment of the invention, the powder 30 is exposed to a soak temperature of about 1500° C. for at a period of time of at least 0.5 hours after the powder has reached equilibrium. In another embodiment the powder is exposed to a soak temperature of at least about 1650° C. for at a period of time of at least 0.5 hours after the powder has reached equilibrium.

In one embodiment, the green body is sintered in an atmosphere deficient in nitrogen for a period of time sufficient to cause the volume resistivity of the resulting polycrystalline body to be less than about $1 \times 10^{13}$ ohm·cm at a temperature of about 23° C. Optionally, or alternatively, the polycrystalline body is exposed following densification to a temperature of at least about 1000° C. in an atmosphere deficient in nitrogen for a period of time sufficient to cause the volume resistivity of the polycrystalline body to be less than about $1 \times 10^{13}$ ohm·cm at a temperature of about 23° C. In one embodiment, the polycrystalline body is cooled from a sintering temperature to a temperature of at least about 1000° C. Preferably, the polycrystalline body is cooled at a rate less than about 15° C. per minute. The conditions, including the temperature to which the polycrystalline body is cooled, the period of time at which it is maintained at the lower temperature, the composition of the nitrogen deficient atmosphere, and the pressure of the atmosphere, can be any of those described above with regard to treatment of a densified aluminum nitride body.

In another embodiment, the volume resistivity of a body consisting essentially of aluminum nitride can be reduced by heating a densified body, such as a polycrystalline body, to a soak temperature of at least about 1000° C. in an atmosphere deficient in nitrogen. The body can be maintained at soak temperatures, pressures, atmospheres and periods of time as are described above with regard to other embodiments of the invention.

In another embodiment, the invention is an electrostatic chuck, such as is shown in FIG. 1. Electrostatic chuck 10 of the invention includes electrode 12 having first side 14 and second side 16. Electrode 12 is formed of a suitable metal, such as, for example, molybdenum, tungsten or combinations thereof Electrode 12 can be a foil, plate, mesh, screen print or some other suitable shape. Optionally, electrostatic chuck 10 can include additional metal elements. For example, electrostatic chuck 10 can include additional electrodes and/or a heating element (not shown).

Chuck body 18 consists essentially of aluminum nitride. Further, chuck body 18 has first portion 20 at first side 14 of electrode 10 and second portion 22 at second side 16 of electrode 10. First portion 20 of body 18 has a volume resistivity less than about $1 \times 10^{13}$ ohm·cm. The volume resistivity of second portion 22 is within one order of magnitude that of first portion 20. For example, the volume resistivity of second portion 22 will be no less than ten percent of, and no more than ten times greater than that of first portion 20. Termination 24 extends from electrode 12. Preferred electrostatic chucks and methods of fabricating them are described in patent application ELECTROSTATIC, CHUCK AND METHOD OF FABRICATION, filed on Dec. 9, 1999 under Ser. No. 09/457,968, incorporated herein by reference in its entirety, and provisional patent application ELECTROSTATIC CHUCK WITH FLAT FILM ELECTRODE, filed on Dec. 9, 1999 under Ser. No. 60/169, 859 , incorporated herein by reference in its entirety.

The electrostatic chuck of the invention can be fabricated from the materials and by the method described above. In one embodiment, a first green portion in the form of a compacted AIN powder is placed in a dye. A metal element or electrode is placed onto the first green portion. A second portion of the AIN powder is compacted onto and overlaying the metal element or electrode and the resulting preform is hot pressed and exposed to a soak temperature of at least about 1000° C. in an atmosphere deficient in nitrogen for a period of time sufficient to cause the volume resistivity of the polycrystalline body to be less than about $1\times10^{13}$ ohm·cm at a temperature of about 23° C. (room temperature).

The electrostatic chuck of the invention can also be produced by starting with a densified or sintered first portion of the chuck body. The dense portion can be obtained by hot pressing a green AlN precursor, as described above. The metal element or electrode is placed onto one face of the dense first portion. Machining may be employed to provide a flat surface suitable for depositing the electrode. Machining can be employed also to smooth other surfaces. AlN powder is placed and compacted onto and overlaying the electrode. The resulting preform is hot pressed and exposed to a soak temperature of at least about 1000° C. in an atmosphere deficient in nitrogen for a period of time sufficient to cause the volume resistivity of the polycrystalline body to be less than about $1\times10^{13}$ ohm·cm at a temperature of about 23° C. (room temperature).

During the operation of the chuck, voltage is applied to the metal element or electrode. In one arrangement, an electrical contact or termination joins the electrode to a power supply, typically through one or more connectors. Suitable connectors include, but are not limited to, electrically conducting wire, tape, cable and others.

In one embodiment of the invention, the electrical contact between the electrode and a suitable connector can be formed while exposing the chuck to the nitrogen deficient atmosphere, for example, during heat treating, as discussed above.

In one embodiment, the electrical contact is formed by brazing. A hole is drilled in the chuck body to expose a portion of the electrode. A braze material is deposited at the bottom of the hole, onto the exposed portion of the electrode and a connector is contacted to the braze material and secured in place. The assembly is heated at a soak temperature and nitrogen deficient atmosphere as discussed above, thereby attaching the connector to the electrode. In a preferred embodiment, the electrode includes Mo, W or combinations thereof and the braze material includes a first metal, such as, for example, Mo, W and combinations thereof and a second metal such as Ni, Co or combinations thereof. Compositions for which the first and second metals form true solutions, without forming second phases or intermetallic species are preferred. A suitable composition is 99.8% Mo and 0.2% Ni. The connector, or part thereof, preferably includes the first metal, for example, Mo.

The invention is further described through the following examples which are provided for illustrative purposes and is not intended to be limiting.

EXEMPLIFICATION

Materials and Resistivity Measurements

The properties of AlN powders A, B and C which were used in these experiments are summarized in Table 1 below. The A and B powders are derived from a carbothermal reduction process while C is believed to be manufactured by direct nitriding.

Electrical resistivity (DC) of coupon samples was measured according to ASTM D237-93 using an excitation time of 60 seconds and 500 Volts, which represents an electric field of 500 V/mm since the coupons were each 1 mm thick. Resistivities were measured as a function of temperature for selected coupons up to a maximum of 350° C. Results are shown in Tables 2 and 3 (room temperature) and FIGS. 2 through 5 (resistivity versus temperature).

TABLE 1

Properties of AlN Powders

| Item | Powder A | Powder B | Powder C |
| --- | --- | --- | --- |
| Surface Area, m²/g | 3.4 | 2.8 | 4.5 |
| Median Particle Size, μm | 1.4 | 1.6 | 1.0 |
| Impurities, ppm | | | |
| Fe | 5 | 9 | 10 |
| Cu | <2 | <2 | 7 |
| Ni | <7 | <6 | 0 |
| Zn | <1 | <1 | 0 |
| Cr | <4 | <3 | 2 |
| Co | <1 | <1 | 0.2 |
| Na | <2 | 6 | 12 |
| K | 3 | <5 | 0.9 |
| Mg | <0.1 | <0.1 | 23 |
| Ca | 5 | 194 | 0 |
| Ti | 0.3 | 19 | 0.4 |
| V | <3 | <4 | ND |
| Zr | <1 | 2 | 0.7 |
| Si | 48 | 151 | ND |
| B | <4 | <3 | 0 |
| O | 9600 | 8023 | 20600 |
| C | <100 | <106 | 460 |

ND = Not Determined

EXAMPLE 1

Pressureless (conventional) sintered AlN samples (50 mm×50 mm×1 mm) were prepared using the AlN powder A with $Y_2O_3$ as a sintering aid. The amounts of $Y_2O_3$ used ranged from about 2% to about 5% weight %. Coupons 25 mm×25 mm×1 mm thick were cut from these samples and subjected to the heat treatment cycles outlined in Table 2 below. In each case, the coupons were cleaned with methanol, dried, and placed in an AlN crucible for heat treatment. Resistivity measurements in the as-sintered as well as after heat treatment are shown in Table 2 and FIG. 1.

Figure 2:
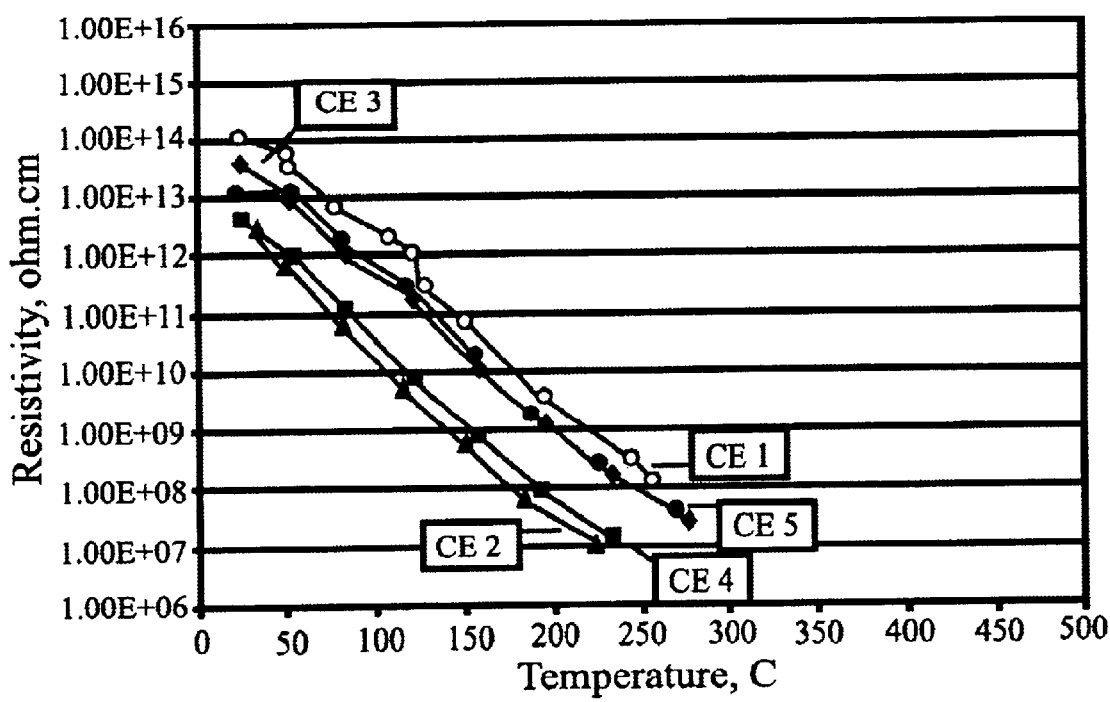
FIG. 2 is plot representation of the temperature dependence of resistivity of sintered polycrystalline AlN materials prepared by conventional, pressureless sintering.
Figure 3:
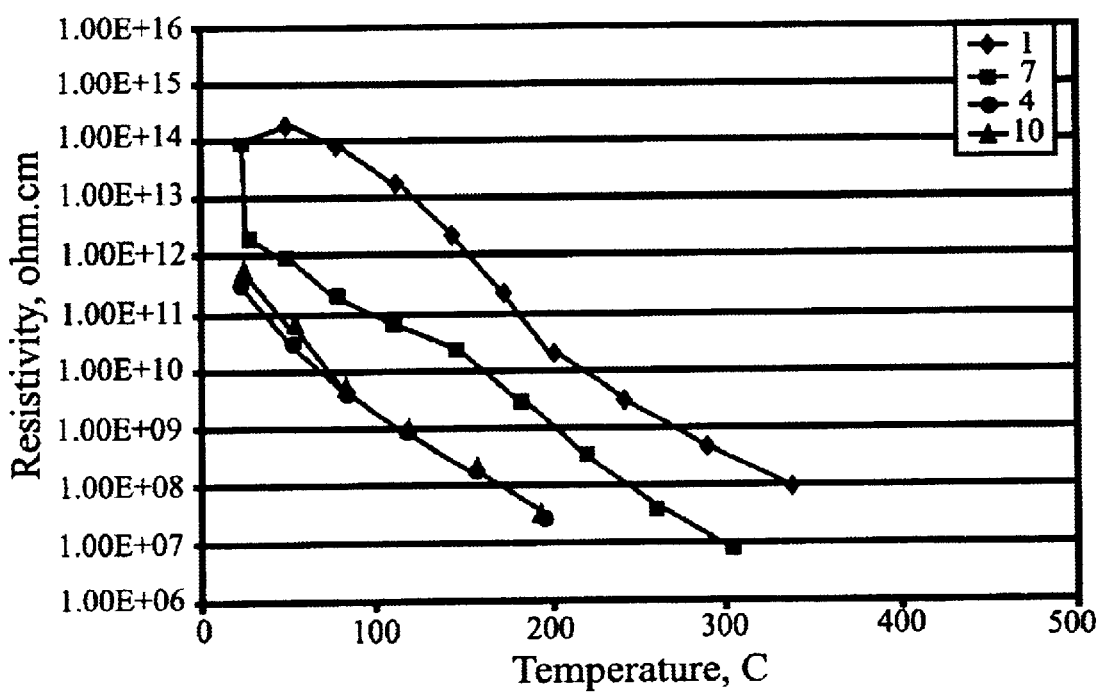
FIG. 3 is a plot representation of the temperature dependence of resistivity of sintered polycrystalline samples prepared from powders A, B and C.
Figure 4:
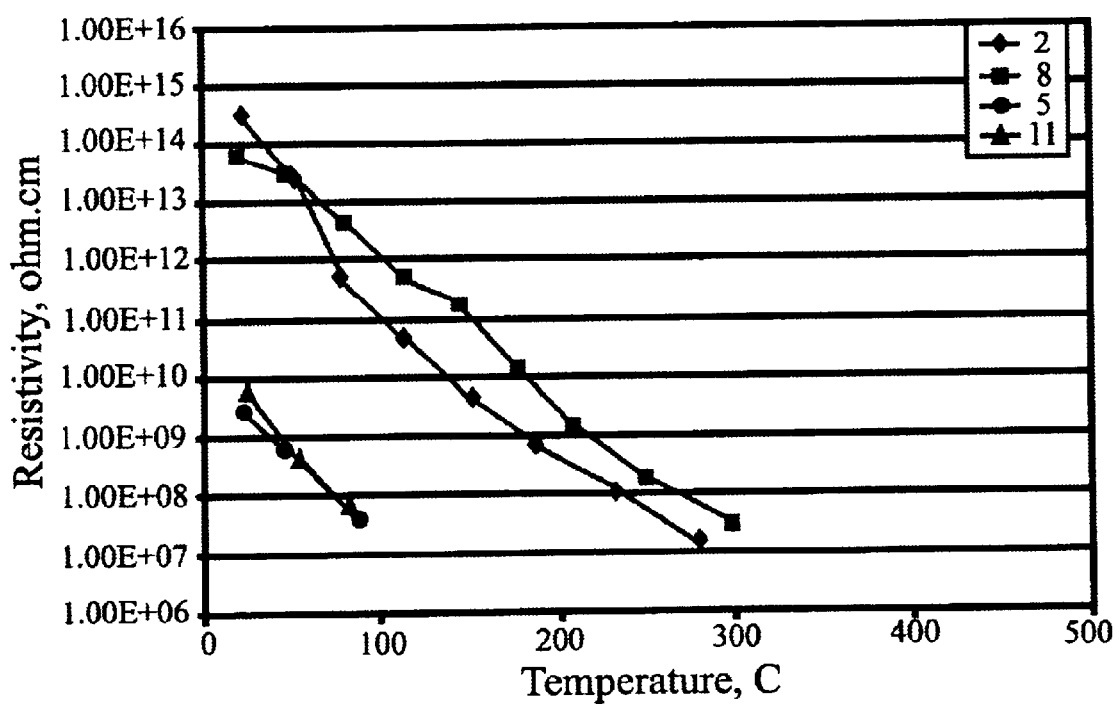
FIG. 4 is a plot representation of the temperature dependence of resistivity of sintered polycrystalline samples prepared from powder B.
Figure 5:
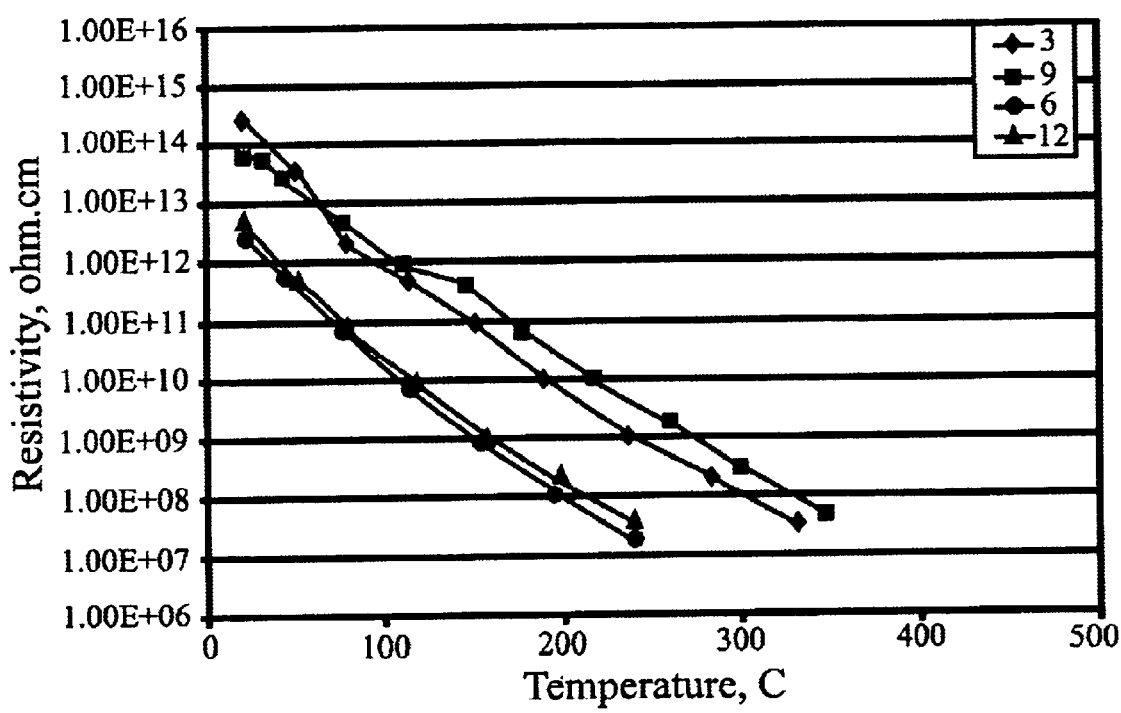
FIG. 5 is a plot of temperature dependence of resistivity of sintered polycrystalline samples prepared from powder C.

As seen in Table 1 and FIG. 2, annealing in a nitrogen deficient atmosphere such as argon (Ar) decreased the room temperature resistivity more effectively than in $N_2$. Cooling to 1200° C. in a controlled manner did not result in a significant difference than cooling to 1500° C. Finally, none of the comparative examples, regardless of heat treatment cycle or atmosphere used, exhibited less than $10^{12}$ ohm·cm resistivity at room temperature.

EXAMPLE 2

B, A, and C. AlN raw powders were cold pressed in a stainless steel die into puck preforms approximately 75 mm in diameter and 20 mm thick. No sintering aids were used with these powders. These puck preforms were loaded into a BN coated graphite sleeve contained in a graphite hot pressing die. Preforms were separated from each other with BN coated graphite spacers. Hot pressing was conducted at 1850° C. for 2 hours in $N_2$ at 20.6 MPa (3000 psi). The heating rate was such that the soak temperature was reached in 4.5 hours. After the soak, the load was taken off and the cooling rate was maintained at 1.4° C./min to 1500° C. At this point, the power was turned off and the die assembly was allowed to free cool to room temperature. Bulk densities of the hot pressed pucks were measured. Each of the pucks approximated 3.26 gm/cc, or 100% of the theoretical density. Subsequently, 25 mm×25 mm×1 mm thick coupons were cut from these pucks, cleaned as above and subjected to heat treatment cycles outlined in Table 3 below. Electrical resistivity measurements are shown in Table 3 and FIGS. 3–5.

TABLE 2

Comparative Examples

| Item | AlN Powder | Densification Route* | Soak Temperature °C. | Soak Time, hrs. | Cool Stop Temperature, °C. | Cool Rate, °C./min | Atmosphere | DC Resistivity @ RT, ohm · cm |
|---|---|---|---|---|---|---|---|---|
| CE1 | A | PS | No heat treatment (as-sintered) | | | | | $1 \times 10^{14}$ |
| CE2 | A | PS | 1650 | 4 | 1500 | 15 | Ar | $7.7 \times 10^{12}$ |
| CE3 | A | PS | 1650 | 4 | 1500 | 15 | $N_2$ | $3.7 \times 10^{13}$ |
| CE4 | A | PS | 1650 | 4 | 1200 | 15 | Ar | $4.4 \times 10^{12}$ |
| CE5 | A | PS | 1650 | 4 | 1200 | 15 | $N_2$ | $1.2 \times 10^{13}$ |

PS—Pressureless Sintering

The as-hot pressed coupons exhibited room temperature electrical resistivities of approximately $10^{14}$ ohm·cm regardless of the type of high purity AlN powder used (See Table 3). Subjecting them to a heat treatment cycle in the presence of $N_2$ did not significantly change their resistivities. However, annealing in Ar produced a dramatic decrease in resistivity for the A based AlN and especially for the B based AlN coupons. For the B AlN, a drop of almost five orders of magnitude was registered. This dramatic decrease in resistivity was both significant and unexpected in light of the comparative examples.

TABLE 3

Examples of High Purity AlN

| Item | AlN Powder | Densification Route | Soak Temperature °C. | Soak Time, hrs. | Cool Stop Temperature, °C. | Cool Rate, °C./min | Atmosphere | DC Resistivity @ RT, ohm · cm |
|---|---|---|---|---|---|---|---|---|
| 1 | A | Hot Pressing | No heat treatment (as-hot-pressed) | | | | | $9.9 \times 10^{13}$ |
| 2 | B | Hot Pressing | No heat treatment (as-hot-pressed) | | | | | $2.8 \times 10^{14}$ |
| 3 | C | Hot Pressing | No heat treatment (as-hot-pressed) | | | | | $3.3 \times 10^{14}$ |
| 4 | A | Hot Pressing | 1650 | 4 | 1500 | 15 | Ar | $3.3 \times 10^{11}$ |
| 5 | B | Hot Pressing | 1650 | 4 | 1500 | 15 | Ar | $3.8 \times 10^{9}$ |
| 6 | C | Hot Pressing | 1650 | 4 | 1500 | 15 | Ar | $2.9 \times 10^{12}$ |
| 7 | A | Hot Pressing | 1650 | 4 | 1500 | 15 | $N_2$ | $8.9 \times 10^{13}$ |
| 8 | B | Hot Pressing | 1650 | 4 | 1500 | 15 | $N_2$ | $6.3 \times 10^{13}$ |
| 9 | C | Hot Pressing | 1650 | 4 | 1500 | 15 | $N_2$ | $7.1 \times 10^{13}$ |
| 10 | A | Hot Pressing | 1650 | 4 | 1200 | 15 | Ar | $4.0 \times 10^{11}$ |
| 11 | B | Hot Pressing | 1650 | 4 | 1200 | 15 | Ar | $7.5 \times 10^{9}$ |
| 12 | C | Hot Pressing | 1650 | 4 | 1200 | 15 | Ar | $5.3 \times 10^{12}$ |

EXAMPLE 3

Electrostatic chucks were fabricated as follows.

(i) A mold cavity, approximately 305 mm (12 in) in diameter, was formed by assembling a graphite die, a graphite sleeve insert, a graphite spacer with a thin sheet of grafoil on top, and a graphite piston. AlN raw powder A (no sintering aids) was poured directly into the mold cavity. The powder was then compacted with an aluminum plunger so as to present a flat upper surface. A perforated molybdenum electrode foil, approximately 254 mm (10 in) in diameter and 0.125 mm thick (0.005 in), was placed on this surface at the center. Additional AlN powder was poured on top of the electrode and the entire assembly was compacted with an aluminum plunger. Another sheet of grafoil was placed on top followed by a graphite spacer and a piston. This assembly was subsequently hot pressed at 1850° C. for 2 hours in $N_2$ at 20.6 MP (3000 psi). The heating rate was such that the soak temperature was reached in 6 hours (i.e., approximately 5° C./min). After the soak, the load was gradually reduced and the cooling rate was maintained at 1.4° C./min to 1500° C. At this point, the power was turned off and the die assembly was allowed to free cool to room temperature in a $N_2$ ambient. The resultant bulk density of the hot pressed chuck was 3.333 gm/cc which reflects the fact that the chuck contains a denser Mo embedded electrode. Microfocus X-ray did not reveal any defects or cracks in the chuck body. The room temperature resistivity of the chuck (measured at 500 V) was $2.1 \times 10^{13}$ ohm·cm.

(ii) The same method was repeated for the AlN B powder to produce a 300 mm Johnson-Rahbek chuck.

(iii) Instead of using a Mo foil electrode, a Mo mesh electrode was used to fabricate AlN electrostatic chucks. For example, mesh electrodes had 30 wires per inch with a wire diameter of 0.0085 inches or 50 wires per inch with a wire diameter of 0.005 inches.

(iv) A two-step process was used to fabricate chucks. Instead of embedding an electrode as in (i), (ii) or (iii), only a dense AlN body was fabricated by hot pressing as above as a first step. After both surfaces were machined flat, this body was placed in the above graphite die/sleeve assembly. A Mo electrode (either foil or mesh form) was placed on the dense AlN surface. AlN raw powder was poured on top of the electrode and compacted with an aluminum plunger. A grafoil sheet and a graphite spacer and piston completed the assembly. This assembly was hot pressed at the same conditions as in (i).

Chucks prepared as described by the methods under (i) through (iv) were subjected to resistivity adjustments as follows.

(A) In order to confirm the effect of the heat treatment on 300 mm parts, a chuck blank with no embedded electrode was subjected to an annealing cycle consisting of 4 hours at 1700° C. in argon. The resulting resistivity at an electric field of 500 V/mm of the AlN chuck blank was $3.3 \times 10^{9}$ ohm·cm at room temperature. Subsequently, a mesh electrode based chuck was annealed using the same cycle. The resultant room temperature resistivity was $1.3 \times 10^{10}$ ohm·cm.

(B) The above resistivity adjustment was also incorporated into the hot pressing cycle. To this end, a study was conducted where a 75 mm puck blank (no electrode embedded) was hot pressed in Ar instead of the usual ambient of $N_2$. Not only was the densification of AlN successful (i.e., better than 99.5% of theoretical achieved) but the room temperature resistivity measurement showed that the resistivity of the puck was also adjusted downward to $5.8 \times 10^{10}$ ohm·cm. This was an unexpected result.

(C) Separately, 300 mm AlN chucks containing an embedded electrode were fabricated by hot pressing at 1850° C. for 3 hours at 20.6 MPa (3000 psi) in an Ar atmosphere instead of the usual $N_2$ atmosphere. After the soak, the temperature was decreased at 1.4° C./min to 1500° C. at which point the power was turned off. The as-hot-pressed resistivity decreased from about $1 \times 10^{14}$ ohm·cm (typical of $N_2$ ambient during hot pressing) to about $1 \times 10^{11}$ to $1 \times 10^{12}$ ohm·cm. One of the chucks was heat treated at 1700° C. for 4 hours in Ar. Coupons were cut from the heat treated chuck and an as-hot-pressed chuck for resistivity measurements. These coupons were obtained from the above and below the electrode at two radial locations—from the center and from about 25 mm from the edge. Room temperature resistivity values obtained at 500 V/mm are listed in Table 4.

TABLE 4

| Chuck Condition | Coupon Location | Rt Resistivity, ohm · cm |
| --- | --- | --- |
| As Hot Pressed (Ar) | Center/Above Electrode | $2.7 \times 10^{11}$ |
| | Center/Below Electrode | $5.5 \times 10^{11}$ |
| | Edge/Above Electrode | $1.1 \times 10^{12}$ |
| | Edge/Below Electrode | $2.7 \times 10^{12}$ |
| After Heat Treatment | Center/Above Electrode | $2.3 \times 10^{10}$ |
| | Center/Below Electrode | $1.2 \times 10^{10}$ |
| | Edge/Above Electrode | $1.8 \times 10^{10}$ |
| | Edge/Below Electrode | $2.8 \times 10^{10}$ |

It can be seen from Table 4 that the resistivity of the as-hot-pressed coupons are already in the $10^{11}$ to $10^{12}$ ohm·cm range and fairly uniform. After heat treatment, the resistivity values are all in the desired range and extremely uniform both above and below the embedded electrode, i.e., radially and through the thickness. Considering that the die/sleeve/chuck assembly during hot pressing is fairly tightly packed and that several chucks are processed simultaneously, it is necessary to optimize the combined hot press/anneal cycle to adjust the resistivity to the target levels in one step. Example 4

An analysis of the AlN hot pressed material was conducted to ascertain selected material properties. Purity information was determined via combustion analysis and Inductively Coupled Plasma (ICP), and AlN grain size information was obtained from polished and etched samples via quantitative image analysis and are shown in Table 5.

TABLE 5

| Item | AlN powder A | AlN powder B |
| --- | --- | --- |
| Density, % of Theoretical | >99.3 | >99.3 |
| Mean AlN Grain Size, μm | 1.7 | 2.9 |
| Electrical Resistivity at RT, ohm · cm | $7.5 \times 10^{13}$ | $2.8 \times 10^{14}$ |
| After Heat Treatment | $10^{10} - 5 \times 10^{11}$ | $10^9 - 10^{11}$ |
| Impurities, ppm | | |
| Fe | 13 | 10 |
| Cu | <3 | <2 |
| Ni | <5 | <6 |

TABLE 5-continued

| Item | AlN powder A | AlN powder B |
| --- | --- | --- |
| Zn | <1 | <1 |
| Cr | <4 | <4 |
| Co | <1 | <1 |
| Na | 6 | 8 |
| K | <3 | 4 |
| Mg | <4 | 7 |
| Ca | 112 | 156 |
| Ti | <5 | 16 |
| V | 2 | 3 |
| Zr | <1 | 1 |
| Si | 192 | 297 |
| B | 23 | <6 |
| O | 12257 | 12215 |
| C | 138 | <133 |

Example 5

Electrostatic chuck samples were sintered but hot heat treated or exposed to a nitrogen deficient atmosphere, essentially as described in Example 3. Two types of electrodes were employed: a mesh-based and a screen print. A hole was formed from the back (thicker side) of the electrostatic chuck assembly to expose the embedded electrode. A powder having the nominal composition of 99.8% Mo-0.2% Ni was deposited at the bottom of the hole, in contact with the exposed portion of the electrode. A Mo connector was inserted in the hole, in physical contact with the powder and secured in place. The samples were heated to about 1700° C. for 4 hours in Ar. The resulting samples were cooled and subjected to pull tests which demonstrated that a strong electrical contact between both types of electrodes was formed. At the same time, the volume resistivity of the chuck body had decreased to $5 \times 10^9 - 5 \times 10^{10}$ ohm·cm.

Example 6

AlN powder B was placed in a crucible and exposed to an Ar atmosphere at about 1650° C., essentially as employed to lower the volume resistivity of a sintered AlN body. The powder was cooled to room temperature, de-agglomerated if necessay, and employed to form an electrostatic chuck, as described above. The hot pressing step was conducted under Ar. The resulting chuck had a room temperature resistivity value, measured at 500 V/mm, of about $2.2 \times 10^7$.

EQUIVALENTS

Those skilled in the art will recognize, or be able to ascertain using no more than routine experimentation, many equivalents to the specific embodiments of the invention described specifically herein. Such equivalents are intended to be encompassed in the scope of the following claims.

What is claimed is:

1. A method for reducing volume resistivity of a body consisting essentially of aluminum nitride, comprising exposing the body to a temperature of at least about 1000° C. in an atmosphere deficient in nitrogen, wherein a partial pressure of nitrogen in said atmosphere is less than about 35 kPa, and wherein the body has a relative density greater than about 98% of theoretical density.

2. The method of claim 1, wherein said body is polycrystalline.

3. The method of claim 1, wherein said atmosphere consists essentially of a gas selected from the group consisting of argon, helium, and mixtures thereof.

4. The method of claim 3, wherein said atmosphere consists essentially of argon.

5. The method of claim 4, wherein the body is exposed to a temperature of at least about 1200° C.

6. The method of claim 5, wherein the body is exposed to a temperature of at least about 1500° C.

7. The method of claim 6, wherein the body is exposed to a temperature of at least about 1650° C.

8. The method of claim 3, wherein the body is exposed to said temperature for a period of at least about 0.5 hours after the body has reached thermal equilibrium.

9. The method of claim 8, wherein the body is exposed to said temperature for a period of at least about four hours after the body has reached thermal equilibrium.

10. The method of claim 7, further including steps of cooling the body at a rate of less than about 15° C. per minute to a temperature of less than about 1200° C.

11. The method of claim 10, wherein the body is cooled to a temperature of about 1500° C.

12. The method of claim 1, wherein the atmosphere is at a pressure of at least about 1 Pa.

13. The method of claim 1, wherein the atmosphere is at a pressure of between about 7 kPa and about 14 kPa.

14. The method of claim 3, wherein the polycrystalline body is exposed to said atmosphere at a temperature of at least about 1650° C. for a period of at least about four hours, and wherein the atmosphere is at a pressure of about 20 MPa.

15. The method of claim 14, further including the step of cooling the polycrystalline body to a temperature of about 1500° C. at a rate of about 15° C. per minute.

16. The method of claim 1, wherein said body is a green body.

17. The method of claim 16, wherein the green body includes aluminum nitride particles having an average particle size in a range of between about 0.1 $\mu$m and about 5.0 $\mu$m.

18. The method of claim 17, further including the step of sintering said green body.

19. The method of claim 18, wherein said green body is sintered at a temperature of at least about 1600° C.

20. The method of claim 19, wherein said green body is sintered in an atmosphere deficient in nitrogen.

21. The method of claim 20, wherein said atmosphere consists essentially of argon.

22. The method of claim 21, wherein said green body causes said body to become polycrystalline.

23. The method of claim 22, further including the step of cooling said polycrystalline body to about 25° C. prior to exposing the body to a temperature of at least about 1000° C. in an atmosphere deficient in nitrogen.

24. The method of claim 23, wherein the polycrystalline body is exposed to a temperature of at least about 1600° C. for a period of at least about four hours.

25. The method of claim 24, further including the step of cooling the polycrystalline body to a temperature less than about 1500° C. at a rate less than about 15° C. per minute.

26. The method of claim 18, wherein the green body is sintered at a pressure in a range of between about 10 MPa and about 50 MPa.

27. The method of claims, wherein the green body is sintered at a pressure of at least about 10 MPa.

28. The method of claim 27, wherein the green body is sintered at a pressure of about 20 MPa.

29. The method of claim 1, wherein the body is exposed to said temperature in excess of about 1000° C. for a period of time sufficient to cause the volume resistivity to be in a range of between about $1 \times 10^8$ ohm·cm and $1 \times 10^{13}$ ohm·cm at a temperature of about 23° C.

30. The method of claim 1 wherein the body is formed from an AlN powder and said powder is exposed to a temperature of at least about 1000° C. in an atmosphere deficient in nitrogen.

31. A method for forming a polycrystalline aluminum nitride body having a volume resistivity less than about $1 \times 10^{13}$ ohm·cm at a temperature of about 23° C., comprising the steps of:
   a) sintering a green body consisting essentially of aluminum nitride to form a polycrystalline body and;
   b) exposing said polycrystalline body to soak temperature of at least about 1000° C. in an atmosphere deficient in nitrogen for a period of time sufficient to cause the volume resistivity of the polycrystalline body to be less than about $1 \times 10^{13}$ ohm·cm at a temperature of about 23° C., wherein a partial pressure of nitrogen in said atmosphere is less than about 35 kPa, and wherein the polycrystalline body has a relative density greater than about 98% of the theoretical density.

32. The method of claim 31, wherein the atmosphere deficient in nitrogen consists essentially of argon.

33. The method of claim 32, wherein the green body includes aluminum nitride and powder having an average particle size in a range of between about 0.1 $\mu$m and about 5.0 $\mu$m.

34. The method of claim 33, wherein the polycrystalline body is cooled from a sintering temperature to at a rate less than about 15° C. per minute.

35. The method of claim 34, wherein the green body is sintered in a nitrogen-deficient atmosphere.

36. The method of claim 35, wherein the green body is sintered in an atmosphere consisting essentially argon.

37. The method of claim 36, wherein the green body is sintered at a pressure in a range of between about 10 MPa and about 50 MPa.

38. The method of claim 36, wherein the green body is sintered at a pressure of at least about 10 MPa.

39. The method of claim 31, wherein the body is formed from an AlN powder exposed to a soak temperature of at least about 1000° C. in an atmosphere deficient in nitrogen.

40. A method of reducing the volume resistivity of an electrostatic chuck consisting essentially of aluminum nitride, comprising exposing at least a portion of the electrostatic chuck to a temperature of at least about 1000° C. in an atmosphere deficient in nitrogen, wherein a partial pressure of nitrogen in said atmosphere is less than about 35 kPa, and wherein the chuck has a relative density greater than about 98% of theoretical density.

41. The method of claim 40, wherein the atmosphere consists essentially of argon.

42. The method of claim 40, wherein the electrostatic chuck is exposed to said temperature in excess of 1000° C. for a period of time sufficient to cause the volume resistivity of the chuck to be in a range of between about $1 \times 10^8$ ohm·cm and about $1 \times 10^{13}$ ohm·cm at a temperature of about 23° C.

43. A method for forming a polycrystalline aluminum nitride electrostatic chuck, comprising the steps of:
   forming a green body consisting essentially of aluminum nitride powder without addition of sintering aids;
   sintering the green body to form a polycrystalline body, wherein sintering is carried out at a pressure of at least about 10 MPa; and
   exposing the polycrystalline body to a temperature of at least 1000° C. in an atmosphere deficient in nitrogen, wherein a partial pressure of nitrogen in said atmosphere is less than about 35 kPa, and wherein the polycrystalline body has a relative density greater than about 98% of theoretical density.

\* \* \* \* \*

UNITED STATES PATENT AND TRADEMARK OFFICE
CERTIFICATE OF CORRECTION

PATENT NO. : 6,723,274 B1
DATED : April 20, 2004
INVENTOR(S) : Ramesh Divakar

It is certified that error appears in the above-identified patent and that said Letters Patent is hereby corrected as shown below:

Column 13,
Line 54, "method of claims," should read -- method of claim 18, --.

Signed and Sealed this

Twenty-seventh Day of September, 2005

JON W. DUDAS
*Director of the United States Patent and Trademark Office*